US007851365B1

(12) United States Patent
Herbots et al.

(10) Patent No.: US 7,851,365 B1
(45) Date of Patent: Dec. 14, 2010

(54) METHODS FOR PREPARING SEMICONDUCTOR SUBSTRATES AND INTERFACIAL OXIDES THEREON

(75) Inventors: Nicole Herbots, Tempe, AZ (US);
James Bradley, Mesa, AZ (US); Justin Maurice Shaw, Boulder, CO (US);
Robert J. Culbertson, Tempe, AZ (US);
Vasudeva Atluri, Scottsdale, AZ (US)

(73) Assignee: Arizona Board of Regents, a coporate body organized under Arizona Law, Acting on behalf of Arizona State Univesity, Tempe, AZ (US)

( * ) Notice: Subject to any disclaimer, the term of this patent is extended or adjusted under 35 U.S.C. 154(b) by 341 days.

(21) Appl. No.: 11/741,563

(22) Filed: Apr. 27, 2007

Related U.S. Application Data

(60) Provisional application No. 60/795,362, filed on Apr. 27, 2006.

(51) Int. Cl.
*H01L 21/311* (2006.01)
(52) U.S. Cl. .................................. 438/694; 438/689
(58) Field of Classification Search .................. 257/410;
438/126, 240, 261, 289, 3, 708, 694, 26;
501/98
See application file for complete search history.

(56) References Cited

U.S. PATENT DOCUMENTS

| | | | | |
|---|---|---|---|---|
| 4,871,416 A | * | 10/1989 | Fukuda | 438/708 |
| 6,023,082 A | * | 2/2000 | McKee et al. | 257/295 |
| 6,511,876 B2 | * | 1/2003 | Buchanan et al. | 438/240 |
| 6,613,677 B1 | * | 9/2003 | Herbots et al. | 438/694 |

| | | | | |
|---|---|---|---|---|
| 2007/0161494 A1 | * | 7/2007 | Fukuyama et al. | 501/98.1 |

FOREIGN PATENT DOCUMENTS

JP        02145767 A    *   6/1990

OTHER PUBLICATIONS

Bradley, "A New Heteroepitaxial Silicon Dioxide Nanophase on OH-(1X1) Silicon (100) Identified via 3.05 MeV Ion Channeling and the New 3-D Multistring Code," Ph.D. dissertation, Arizona State University, Tempe, AZ (2006).
J. Shaw, "Heteroepitaxial Oxide Sample Processing", Ph.D. dissertation, Arizona State University, Tempe, AZ (2006).
Herbots, et al., "The formation or ordered, ultrathin SiO2/Si(100) interfaces grown on (1x1) Si (100)," Materials Science and Engineering, B87, pp. 303-316, (2001).
Shaw, et al., "Atomic displacement free interfaces and atomic registry in SiO2 / (1x1) Si (100)," J. of Appl. Phys., vol. 100, pp. 104109-104133 (2006).
Altulri, et al., "Hydrogen passivation of Si(100) wafers as templates for low temperature (T < 600°C) epitaxy," Nucl. Instrum. Methods Phys. Res. vol. B118 (1-4), 144-140 (1996).

(Continued)

*Primary Examiner*—Thanh V Pham
*Assistant Examiner*—Errol Fernandes
(74) *Attorney, Agent, or Firm*—McDonnell Boehnen Hulbert & Berghoff LLP

(57) ABSTRACT

The invention provides novel methods for preparing semiconductor substrates for the growth of an ultra-thin epitaxial interfacial phase thereon. The invention additionally provides the ultra-thin epitaxial interfacial phase formed on a semiconductor substrate prepared by the methods of the invention. Epitaxiality of the interfacial phase is ensured by maintaining the cleaned semiconductor substrate in a static and inert atmosphere prior to oxidation to form the interfacial phase. Such interfacial phase are useful as capping layers and dielectric layers for semiconductor devices.

23 Claims, 3 Drawing Sheets

OTHER PUBLICATIONS

Feldman, et al., Fundamentals of Surface and Thin Film Analysis, North Holland, New York 1986. pp. 120-123.

Feldman and Picraux, Materials Analysis by ION Channeling, Academic, New York (1982) pp. 159-160.

Leavit, et al., "Cross sections for 170.5° backscattering of 4He from oxygen for 4He energies between 1.8 and 5.0 MeV," Nucl. Instrum. Methods Phys Res., vol. B44 (3), pp. 260-265 (1990).

Ourmazd, et al., "Si-SiO2 Transformation: Interfacial Structure and Mechanism," Phys. Rev. Lett., vol. 59, pp. 213-216 (1987).

Munkholm, et al., "Observation of a Distributed Epitaxial Oxide in Thermally Grown SiO2 on Si(001)" Phys. Rev. Lett., vol. 75, p. 4254-4257 (1995).

Wilk, et al., "High-k gate dielectrics: Current status and materials properties considerations," J. of Appl. Phys., vol. 89 (10): pp. 5243-5275 (2001).

Queeney, K. T., et al. "Infrared spectroscopic analysis of an ordered Si/SiO2 interface," Applied Physics Letters, vol. 84(4): 493-495 (2004).

Hurst, Q. B., et al. "Long range order in ultra-thin SiO2grown on ordered Si(100)," Symposium, 5-8 (1999) 181-187 ; Ultrathin SiO2 and High-K Materials for ULSI Gate Dielectrics. Symposium.

Herbots, N., et al. "Discovery of long range order in thin (2-20 nm) SiO2films by ion beam analysis," Defect and Impurity Engineered Semiconductors II. Symposium, 13-17 (1998) 137-142.

Atluri, V., et al. "Comparison and reproducibility of H-passivation of Si(100) with HF in methanol, ethanol, isopropanol and water by IBA, TMAFM, and FTIR Science and Technology of Semiconductor Surface Preparation," Symposium, 1-3 (1997) 281-292.

Hearne, S., et al., "Jacobsson, H. Characterization of carbon in heteroepitaxial Si1-x-yGexCy thin films via combined ion channeling and nuclear resonance analysis," Nuclear Instruments & Methods in Physics Research, Section B (Beam Interactions with Materials and Atoms). vol. 118(1-4):88-96 (1996).

Atluri, V., et al., "H-passivation of Si(100) surfaces : Correlation with ion beam characterization (elastic recoil and nuclear resonance) and atomic force microscopy," Proceedings of Fifth International Symposium. ULSI Science and Technology, 23-26 (1995) 116-128.

* cited by examiner

METHODS FOR PREPARING SEMICONDUCTOR SUBSTRATES AND INTERFACIAL OXIDES THEREON

CROSS-REFERENCE TO RELATED APPLICATIONS

This application claims the priority of U.S. Provisional Application No. 60/795,362, filed on Apr. 27, 2006, which is hereby incorporated by reference in its entirety.

FIELD OF THE INVENTION

This invention relates to methods for preparing semiconductor substrates, the semiconductor oxides grown thereon, and more specifically, to epitaxial oxides grown on the surface of semiconductors, and the interfacial layer formed between the oxide and the semiconductor.

BACKGROUND OF THE INVENTION

Ever since the first integrated circuit was demonstrated, one goal of the electronics industry has been to increase the density of individual devices in an integrated circuit. Ultimately, as smaller devices are made, the devices can be packed more densely, which reduces transmission between devices and also allows for faster operation.

Metal oxide semiconductor (MOS) technology forms the basis for a large part of chip manufacturing. In typical MOS transistor technology, silicon dioxide ($SiO_2$) is grown on a silicon substrate so as to form part of a metal oxide semiconductor gate. $SiO_2$ so formed is commonly referred to as a gate oxide or a gate oxide dielectric. Until recently, $SiO_2$ grown on MOS transistor gates has always been thought of as amorphous with little ordering in the first atomic layers at the interface between the silicon substrate and the oxide layer. Silicon has been used commercially as a semiconductor preferentially over other materials because it readily forms stable oxide dielectric layers with a lower interface defect density than other semiconductors and their oxides. The stability of $Si/SiO_2$ having a low interface defect density enables the manufacture of transistors with better electrical properties than is attainable with other semiconductors.

The desire for lower dimension devices presents a basic problem: as devices get smaller in three dimensions, the dielectric layer must get both narrower and thinner and continue to function as a dielectric. Silicon does not always provide the optimum physical and electronic properties, such as a low interface defect density or a high dielectric constant, necessary to or tailored to fill a particular need. A desire for materials that have better tailored physical and electronic properties creates another problem: growth of dielectric layers on multi-element semiconductors is difficult. These two problems become essentially insurmountable when one desires a small device made out of a semiconductor other than doped silicon. Conceptually, a solution would lie in producing either a well-ordered ultra-thin oxide on top of the multi-element semiconductor, or at least a more ordered interface between the semiconductor and the dielectric layers. Doing so without elemental or phase separation is extremely difficult especially in chemical systems where the defect generation rate is higher than silicon, and as the physical sizes involved approach atomic dimensions. Any improvement in ordering at the interface or in the material will improve the interface defect density. It will be appreciated that, as smaller devices demand thinner dielectric layers, interface characteristics become increasingly important.

Another goal of electronic device processing is the growth of heterodielectrics or other materials listed below on a semiconductor substrate. While this goal is achievable for some systems, in general, growth of ordered films of a material on a semiconductor substrate is difficult. U.S. Pat. No. 6,613,677, incorporated herein by reference, discloses long range ordered semiconductor interface phase and oxides that can improve many properties of oxides, and in particular $SiO_2$ grown on Si. However, the growth of epitaxial, or continuous crystalline films on semiconductor substrates remains elusive. Herein, are described novel methods for preparing semiconductor substrates and forming epitaxial interfacial layers of oxides thereon.

SUMMARY OF THE INVENTION

In a first aspect, the invention provides a semiconductor substrate prepared by a process comprising the steps of:
  cleaning the surface of the substrate; and
  maintaining the cleaned substrate in a static and inert atmosphere.

In a second aspect, the invention provides a method for depositing an ultra-thin epitaxial interfacial phase on a semiconductor substrate comprising the steps of:
  cleaning the surface of the substrate;
  maintaining the cleaned substrate in a static and inert atmosphere; and
  oxidizing the cleaned substrate,
    wherein the cleaned substrate is maintained in the static and inert atmosphere from the conclusion of the cleaning step until the beginning of the oxidization step.

In a third aspect, the invention provides an ultra-thin epitaxial interfacial phase on a semiconductor substrate prepared by a process comprising the steps of:
  cleaning the surface of the substrate;
  maintaining the cleaned substrate in a static and inert atmosphere; and
  oxidizing the cleaned substrate,
    wherein the cleaned substrate is maintained in the static and inert atmosphere from the conclusion of the cleaning step until the beginning of the oxidization step.

In a fourth aspect, the invention provides an ultra-thin film crystalline dielectric film comprising silicon, oxygen and hydrogen, wherein the surface of the material has one surface atomic step per 100 Å or more.

In a fifth aspect, the invention provides a semiconductor device having an epitaxial interfacial phase and dielectric layer comprising an oxide of a semiconductor material chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, and $(Si_{1-x-y}Ge_xC_y)_3N_{4-x-y}$, and an ordered interface phase of oxygen and hydrogen all on an atomic polished surface of a substrate of the semiconductor material.

In a sixth aspect, the invention provides a semiconductor device having an epitaxial interfacial phase and a dielectric layer comprising an oxidized semiconductor material on an atomically polished substrate of the semiconductor material with a smoothness characterized by one surface atomic step for 100 Å or greater linear distance, wherein the semiconductor material is chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{1-x}(O_yN_{1-y})_n$, $Si_{1-x-y}Ge_xC_y(O_xN_{1-x})_n$, and $(Si_{1-x-y}Ge_xC_y)_3N_{4-x-y}$.

In a seventh aspect, the invention provides an ultra-thin film of β-cristobalite-$SiO_2$.

In an eighth aspect, the invention provides a semiconductor structure comprising a semiconductor substrate, an ultra-thin epitaxial interfacial phase, and a high-k dielectric, wherein the interfacial phase is between the substrate and the dielectric, and is prepared according to the second aspect of the invention.

In a ninth aspect, the invention provides a semiconductor structure comprising a semiconductor substrate and a high-k dielectric, wherein the substrate is prepared according to the first aspect of the invention.

Definitions

Figure 1:
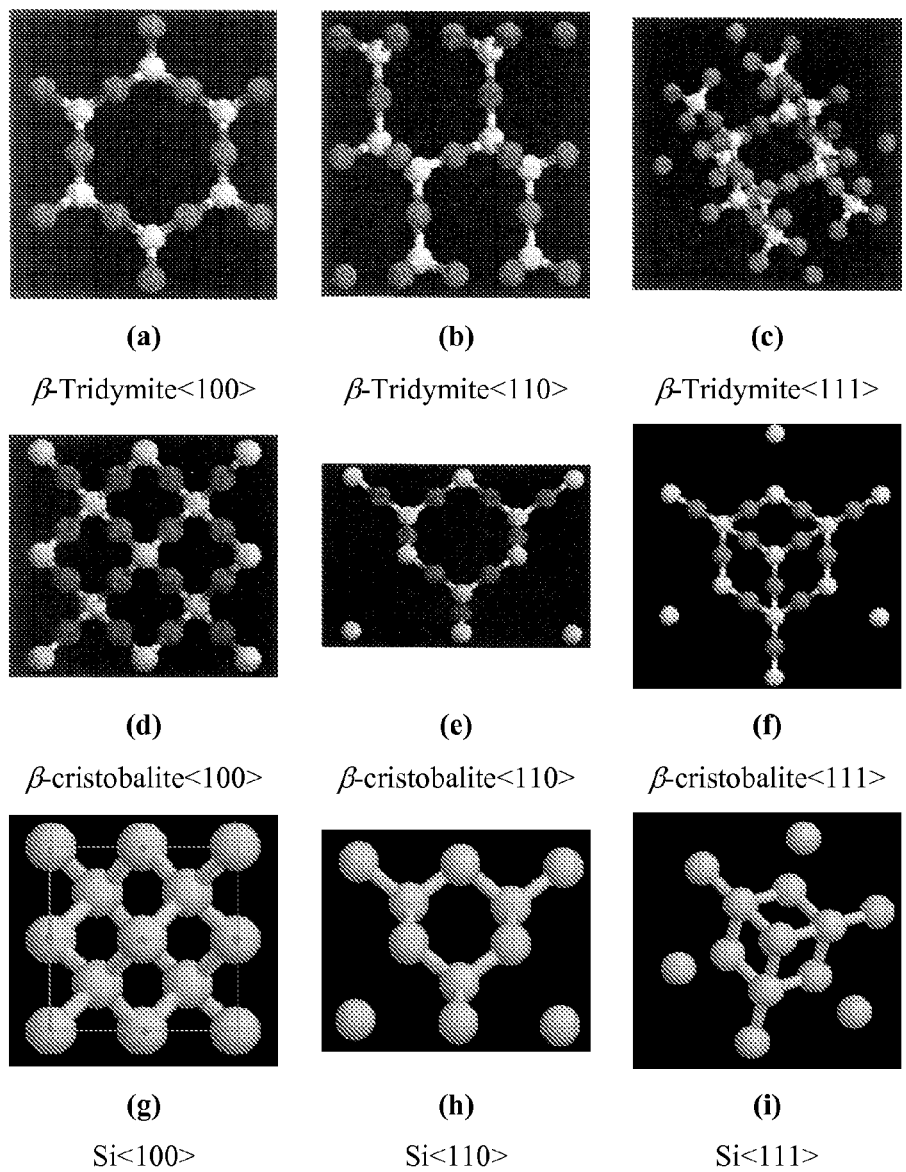
FIG. 1 displays a comparison of (a)-(c) β-tridymite and (d)-(f) β-cristobalite structure with that of (g)-(i) silicon, viewed along <100>, <110>, and <111>, respectively.

As used herein, the terms "epitaxial phase" and "epitaxial material" means a crystalline phase or material grown or otherwise deposited onto a crystalline substrate.

As used herein, the term "crystalline" means a solid form of a substance having three-dimensional order on the level of atomic dimensions. Crystallinity may be detected by diffraction techniques, heat-of-fusion measurements, etc. The amount of disorder within the crystalline region is not incompatible with this concept.

As used herein, the term "Herbots-Atluri Clean" refers to the semiconductor cleaning process as disclosed in U.S. Pat. No. 6,613,677, incorporated herein by reference in its entirety.

In connection with this invention, certain terms are used that are believed to be understood by those skilled in the art. "Long range ordering" is an expression that means, in contradistinction to "short range ordering," a regularity in the location of the atoms in a structure, such as a crystalline structure such that the location of an atom can be accurately predicted three, four, or more positions distant from a known atom location.

"Ultra-thin," as used herein, means having a thickness of 40 Å or less. Preferably, the thickness is 2.5 Å to 40 Å. More preferably, the thickness is 5.0 Å to 40 Å.

"Interface defect density" is an expression used to mean a density of surface defects such atomic steps, missing atoms, or the presences of unfilled bonds. "Low" interface density is interface density lower than that achieved in prior procedures, all other variables being equal.

As used herein, the term "static" means characterized by a lack of movement or progression (e.g. no gas flow).

As used herein, the term "inert atmosphere" means an atmosphere which will not cause degradation or reaction of the sample. Such atmospheres preferably contain limited levels of oxygen and/or water; however, the acceptable level of water and/or oxygen will depend on the samples, and is readily apparent to one skilled in the art. Such atmospheres preferably include gases such as, but are not limited to, nitrogen, helium, and argon, and mixtures thereof.

As used herein, the terms "interfacial phase" and "interfacial material" mean the phase or material at the interface between a two material layers, for example, the layer at the interface between a dielectric layer on the surface of a semiconductor and the semiconductor itself.

As used herein, the term "semiconductor" means any material that is not intrinsically a good conductor and that has a small enough band gap that it could conceivably be doped to function as a semiconductor (i.e. a band gap that is less than approximately 10 eV) and that is chemically and otherwise compatible with the process of the invention.

As used herein, the term "semiconductor-grade" means the component has a purity of at least 99%; preferably, the purity is at least 99.9%; even more preferably, the purity is at least 99.99%.

As used herein, the term "fluoropolymer" means a polymer comprising at least one monomer having fluoro substituents. Examples of fluoropolymers include, but are not limited to, poly(tetrafluoroethylene) [i.e., Teflon™], poly(ethylene-co-tetrafluoroethylene), and poly[4,5-difluoro-2,2-bis(trifluoromethyl)-1,3-dioxole-co-tetrafluoroethylene] [i.e., Teflon™ AF].

As used herein, the term "silicide" means a compound comprising silicon and one or more electropositive elements. Examples of silicides include, but are not limited to, PtSi, $TiSi_2$, and $WSi_2$.

The term "continuous," as used herein, means an uninterrupted molecular network.

The term "coherent crystalline material," as used herein, means that the crystalline structure of the material is aligned with its surrounding structures. For example, for a coherent crystalline thin film on a substrate, the crystalline structure of the thin film is aligned with the crystalline structure of the substrate.

The term "high-k dielectric" as used herein, refers to a material with a high dielectric constant (κ) (relative to silicon dioxide) used in semiconductor manufacturing processes which replaces the silicon dioxide gate dielectric. Example of high-k dielectrics include, but are not limited to, hafnium-based dielectrics (e.g., HfSiON, $HfO_2$, and HfSiO), zirconium silicates and oxides, tantalum oxides (e.g. $Ta_2O_5$), $SrTiO_3$, $Al_2O_3$, $Y2O_3$, $La_2O_3$, and $TiO_2$.

DETAILED DESCRIPTION

The Substrate

Semiconductor substrates suitable for use in the invention include all group IV element and IV, IV-IV, and IV-IV-IV multi-element substances, e.g. Si, Ge, $Si_xGe_{1-x}$, $Si_{1-x-y}Ge_xC_y$, $Ge_xC_{1-x}$, etc. When Ge is the substrate, the solubility of the oxide may preclude use of the standard method disclosed below, but the broad process of creating a very smooth surface along with passivating the Ge surface will produce an ultra-thin dielectric film. III-V semiconductors, e.g. GaAs, AlN, etc., are also expected to be useful as substrate materials because of their high mobility and the ease of modulating their band gap. Nitride containing semiconductors such as $Si_3N_4$ or $Si_{3(1-x)}Ge_{3x}N_{4(1-\delta)}$ will function as substrates as well. Dielectrics on silicon and other group IV, IV-IV, and IV-IV-IV materials such as nitrides and oxynitrides can benefit from this method. These materials are both stable with respect to the solutions employed and can form a passivating hydrogen-based layer when exposed to a hydrogen source. They are also capable of being etched by hydrofluoric acid (HF). II-VI semiconductors (ZnS or ZnSe) also benefit from very flat surface preparation and slow dielectric growth on the surface. Preferably, the substrate comprises a semiconductor material selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, and $(Si_{1-x-y}Ge_xC_y)_3N_{4-x-y}$. More preferably, the substrate comprises Si. Even more preferably, the substrate is Si(100).

In other various aspects of the invention, the semiconductor substrate is substantially planar; preferably, the semiconductor substrate has a polished surface, as known to those skilled in the art.

Substrate Preparation

The substrates are prepared for overgrowth of an interfacial phase according to a two stage process including a cleaning step and "intermediate processing" step prior to oxidation.

(a) Cleaning

The substrates utilized in the various aspects of the invention are cleaned according to methods known in the art for cleaning semiconductor surfaces. For example, appropriate cleaning methods include, but are not limited to one or more of SC1 Clean ($H_2O+NH_4OH+H_2O_2$), SC2 Clean ($H_2O+HCl+H_2O_2$), RCA Clean (SC1, then SC2), Piranha Strip ($H_2SO_4+H_2O_2$), Nitride Strip ($H_3PO_4$), Oxide Strip (HF+$H_2O$), Dry Strip ($N_2O$, $O_2$, $CF_4+O_2$, or $O_3$), and/or the Herbots-Atluri clean. Preferably, the substrate is cleaned, at least, according to the Herbots-Atluri clean. Preferably, the substrate is cleaned, at least, according to the Herbots-Atluri clean, and the Herbots-Atluri clean is the last cleaning performed. In various preferred embodiments, the substrate is cleaned according to the Herbots-Atluri clean. As has been described in U.S. Pat. No. 6,613,677, when a semiconductor substrate is cleaned according the Herbots-Atluri clean, an ordered passivating layer of oxygen and hydrogen is formed on the semiconductor substrate surface.

(b) Intermediate Processing

After cleaning, in an intermediate processing step, the substrates are exposed to a static and inert atmosphere for a sufficient period of time to prevent the accumulation of organic impurities which inhibit growth of the epitaxial phases of the invention. Such an exposure also serves to limit rearrangement of the freshly cleaned surface (particularly, when the substrates are cleaned by the Herbots-Atluri clean) due to impinging oxygen and moisture when the phase has just formed so the stable phase remains heteroepitaxial. Additionally, the exposure of the cleaned substrate to a static and inert atmosphere allows for an equilibrium to form between any remaining volatilizable surface adsorbed molecules and the atmosphere. Desorption of these molecules in the inert atmosphere further cleans the substrate surface.

Preferably, the cleaned substrate is maintained in the static and inert atmosphere from the conclusion of the cleaning step until the beginning of the oxidization step. More preferably, the cleaned substrate is maintained in the static and inert atmosphere for about 30 seconds to 12 months. More preferably, the cleaned substrate is maintained in the static and inert atmosphere for about 30 seconds to 3 days; even more preferably, about 30 seconds to 24 hours. Even more preferably, the cleaned substrate is maintained in the static and inert atmosphere for about 30 seconds to 30 minutes. Even more preferably, the cleaned substrate is maintained in the static and inert atmosphere for about 30 seconds to 5 minutes.

Preferably, the static and inert atmosphere comprises a noble gas, nitrogen, or mixtures thereof. More preferably, the static and inert atmosphere comprises semiconductor-grade noble gas, nitrogen, or mixtures thereof. Even more preferably, the static and inert atmosphere comprises semiconductor-grade nitrogen.

The cleaned substrates of the various aspects of the invention may be exposed to and/or stored in a static and inert atmosphere in a sealed container. Preferably, the sealed container is a fluoropolymer or glass container, or aluminum bag. More preferably, the sealed container is a fluoropolymer or glass container, or aluminum bag and has been cleaned according to a semiconductor-grade cleaning process. Even more preferably, the sealed container is a fluoropolymer or glass container, or aluminum bag and has been cleaned according to a semiconductor-grade cleaning process comprising a peroxide solution (e.g., SC1, SC2, and/or the Herbots-Atluri clean). A plurality of such sealed containers may be stored in a secondary container which itself contains a static and inert atmosphere (supra), for example, a bag or box.

By exposing the cleaned substrates to a static and inert atmosphere, substrates prepared according to the methods of the invention have been stored for over a year in sealed containers (supra) under the static and inert atmosphere. Further, exposing the cleaned substrates to a static and inert atmosphere results substrates of the invention which have in an order of magnitude decrease in surface contamination (e.g., carbon) with respect to surfaces which have only been cleaned and not exposed to the static and inert atmosphere (see, for comparison, Herbots, et al., Mater. Sci. Eng. B87, 303 (2001)).

Interface Phase Overgrowth

In the various aspects of the invention, the interfacial phase is formed on the cleaned semiconductor substrate by any one of the semiconductor oxidation process known by those skilled in the art, after the cleaned semiconductor substrate has been exposed to a static and inert atmosphere (supra). For example, the oxidation process may be one or more processes selected from the group consisting of native oxide formation in ambient air, thermal oxidation, rapid thermal oxidation, and annealing in nitrogen, hydrogen, or a combination thereof.

In some preferred embodiments, when the interfacial phase is formed using thermal or rapid thermal processing, then it can be nucleated and grown between 300-1200 K in atmospheric air or dry oxygen. Preferably, the interfacial phase is nucleated and grown between 900-1100 K in atmospheric air or dry oxygen. In other preferred embodiments, when the interfacial phase is formed using thermal or rapid thermal processing, then it can be nucleated and grown in atmospheric air or dry oxygen at less than 1000 K; more preferably, at between 300K and 1000K; even more preferably, between 900K and 1000K.

The interfacial phases on semiconductor substrates, formed according to the instant invention, are heteroepitaxial films. Such heteroepitaxial interfacial phases are preferably a continuous two-dimensional phase, a true film, or thin sheet of coherent crystalline material, and in particular, are not precipitates or polycrystalline films. Preferably, the heteroepitaxial interfacial phase is a continuous two-dimensional crystalline phase, wherein substantially all atoms are arranged in unit cells whose main axes are aligned in the same orientation.

The new heteroepitaxial interfacial phases (e.g., tetragonally distorted β-cristobalite $SiO_2$ on OH-(1×1) Si(100)) of the present invention have been conceived with the goals to create low temperature passivation (from 300 K, room temperature) and stabilization of clean ordered semiconductor surfaces (e.g., (1×1) Si (100)) in clean-room ambient air for low temperature epitaxy and MOS gate oxide formation; create smooth and flat interface via a step distribution at least one order of magnitude lower than in conventional oxides and semiconductor surfaces to minimize structural and electronic defect nucleation, minimize roughness, and narrow the range of geometrical thickness of ultra-thin films (e.g., 0.5 to 20 nm); decrease defect density at an interface between the substrate and these new interfacial phase films; and provide beneficial properties including enhanced reliability and carrier lifetime in oxides, several order of magnitudes higher chemical stability of surface composition and resistance to surface contamination in air due to both chemical inertness of the terminated smooth surface and the energy stabilization due to the ordered nature of the ordered interphase seeded on the surface to from thin films, and defect-free interface in low temperature epitaxy and heteroepitaxy.

With respect to chemical stability, heteroepitaxial oxides formed in accordance with the present invention exhibit orders of magnitude further improvement of chemical stability during processing with an outer surface that can exhibit a near-zero hydrocarbon deposition and oxidation rate for up to a year.

Further, heteroepitaxial oxides formed in accordance with the present invention provide a subsequent matching stability of electronic parameters, including oxide thickness and dielectric constant.

When the substrate comprises Si (and preferably, Si(100)), the ultra-thin epitaxial interfacial phase prepared according to the instant invention comprises heteroepitaxial $SiO_2$. More preferably, the ultra-thin epitaxial interfacial phase comprises beta-cristobalite-$SiO_2$. The heteroepitaxial nature of the interfacial phase of the invention is evident from a silicon surface peak at zero oxygen coverage of less than bulk Si(100) as measured along the <111> axis by ion beam analysis (see, Examples, infra). For example, a tetragonally distorted β-cristobalite $SiO_2$ interphase of the invention exists between an amorphous $SiO_2$ top film and a (1×1)Si (100) interface. This interphase exhibits a critical thickness between (1×1) Si (100)/epitaxial $SiO_2$ interface and the epitaxial $SiO_2$/amorphous $SiO_2$ interphase.

Further, when the substrate comprises Si (particularly, Si(100)), heteroepitaxial interfacial oxides formed in accordance with the present invention exhibit tetragonal distortion of up to 100% (infra). The heteroepitaxial interfacial phase is a continuous two-dimensional crystalline phase wherein the phase is tetragonally distorted normal to the interface, with an expansion of the crystal unit cell dimensions ranging from 0 to 150% along the surface normal. Even more preferably, the heteroepitaxial interfacial phase of the invention is a cubic cristobalite phase or a tetragonally distorted cristobalite phase.

More preferably, the heteroepitaxial interfacial phase is tetragonally distorted normal to the substrate surface interface, with an expansion of the crystal unit cell dimensions ranging from 0 to 150% along the surface normal, wherein
 substantially all atoms are arranged in unit cells whose main axes are aligned in the same orientation;
 only the <100> axes of the interfacial phase are aligned with the Si substrate; and
 the <110> and <111> axes of the interfacial phase are shifted to accommodate the tetragonal distortion of the phase.

Tetragonal distortion (thus a change in interatomic constant) allows properties of the oxide layer to be further modified or modulated. Tetragonal distortion allows modulation of the dielectric constant of the film (via tetragonal distortion of beta-cristobalite) by a factor 0.6 to 2 which allows for new degrees of freedom in engineering stacked dielectric thin films; seeding both organic and inorganic films in registry with the (1×1) Si(100) substrates thereby enhancing electronic interfacing with or without a dielectric between the two; seeding heteroepitaxial films with registry with the (1×1) Si(100) layers or with the beta-cristobalite structure; interfacial diffusion nano barrier and stable interfacing between reactive films such as peroskvites and high-k dielectrics and Si(100) blocking silicon oxidation by the film; modified optical absorption of the new heteroepitaxial nano-oxides to maximize transmission by absorbing fewer wavelengths. This latter property is important in improving sensor and detector performance using CCD and also in high performance solar cells).

In other various aspects of the invention, when the semiconductor substrate is substantially planar; and preferably, the semiconductor substrate has a polished surface, as known to those skilled in the art, then the epitaxial layer formed according any of the methods of the invention is substantially planar.

Post-Interface Phase Overgrowth Processing

The interface phase serves multiple roles, among those are its function as a dielectric, as a seed layer, and as a barrier. The dielectric function has been discussed. When the phase acts as a seed layer, it does so by allowing atoms of the over-layer to arrange themselves without regard to the atomic arrangement of the substrate.

When the interface phase acts as a barrier, it segregates the semiconductor underneath from any heterodielectric or other material deposited on the surface. This segregation prevents reaction between the substrate and the overlayer and thereby prevents cross contamination between the substrate and a deposited overlayer. Semiconductor substrates can include Si, $Si_x Ge_{1-x}$, GaAs, $Si_{1-x-y} Ge_x C_y$, $Si_{3(1-x)} Ge_{3x} N_{4(1-\delta)}$, Ge, $Si_x Ge_{(1-x)} (O_y N_{1-y})_n$, $Si_{1-x-y} Ge_x C_y (O_z N_{1-z})_n$, $(Si_{1-x-y} Ge_x C_y)_3 N_{4-x-y}$, and GaAlAs. Useful heterodielectrics can include $CaF_2$, $BaF_2$, $SrTiO_3$, $Pb(ZrTi)O_3$, $BaTiO_3$, $Zr(Ca)O_2$, $Zr(Y)O_2$, $LiNbO_3$, ($LiNbO_3$, $SrTiO_3$), (Zr—Ca)$O_2$, $Zr(Y)O_2$), GaAs, $Ga_2O_3$ $As_2$ $O_5$, CdTe, InP, ZnSe, ZnS, HgCdTe, GaSb, InSb, Yttrium Barium Copper Oxide, Lanthanum Strontium Copper Oxide and Barium Europium Copper Oxide.

As the thickness of oxide layers used in semiconductor devices decreases, the properties of the interface between the semiconductor and the oxide layer become more influential in the performance of the device. The oxide layer provides an improved diffusion barrier and allows for improved interfacing of crystalline substrates (e.g., Si, or Si(100)) with reactive films such as peroskvites, high-k dielectrics, and/or silicides.

Over-layer films may be deposited according to those methods known to those skilled in the art. For example, an over-layer may be deposited onto a layer comprising the interphase of the invention by chemical vapor deposition, plasma-enhanced chemical vapor deposition, atomic layer deposition, spin-coating, spray coating, dip coating (e.g., deposition of a Langmuir-Blodgett film), and the like.

Device Manufacture

The process of this invention can be used to make a variety of different semiconductor devices including transistors, diodes, capacitors, resistors, memory, and charge-coupled devices. The process of making integrated circuit transistors is well known in the art. These processes employ layers of dielectric material in various configurations depending on the nature of the device. The process disclosed can be used to form those dielectric material layers.

For example, the methods of the invention may be utilized for preparing a semiconductor device having an epitaxial interfacial phase and dielectric layer comprising an oxide of a semiconductor material chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, and $(Si_{1-x-y}Ge_xC_y)_3N_{4-x-y}$, and an ordered interface phase of oxygen and hydrogen all on an atomic polished surface of a substrate of the semiconductor material.

In another example, the methods of the invention may be utilized for preparing semiconductor device having an epitaxial interfacial phase and a dielectric layer comprising an oxidized semiconductor material on an atomically polished substrate of the semiconductor material with a smoothness characterized by one surface atomic step for 100 Å or greater linear distance, wherein the semiconductor material is chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, and $(Si_{1-x-y}Ge_xC_y)_3N_{4-x-y}$.

In yet another example, the methods of the invention may be utilized for preparing semiconductor device having an epitaxial interfacial phase on a semiconductor substrate and a dielectric layer comprising a high-k dielectric material, peroskvite, or silicide.

In other words, the heteroepitaxial interfacial oxide can provide a crystalline seed to grow a high-k dielectric such as, preferably, $HfO_2$, HfSiON, or $ZrO_2$. Additionally, the heteroepitaxial interfacial oxide can be nitridized prior to high-k dielectric formation in an amorphous phase to take advantage of its superior smoothness and lower defect density without crystallization of the high-k dielectric. It also provides a more advanced pathway where the crystallization of the high-k dielectric is controlled into a grain boundary-free structure with even more improved electrical characteristics, such as low leakage and better controlled dielectric constant.

In another example, the substrate (e.g., (1×1)Si(100)) as prepared according to the invention prior to oxide growth (supra) can, itself, provide a crystalline seed to grow a high-k dielectric such as $HfO_2$, HfSiON, or $ZrO_2$. In this case, where no epitaxial layer is used, the substrate prepared according to the invention provides a seed or template for high-k dielectric with a superior smoothness since its roughness is lower by at least an order of magnitude when compared with surface and oxide conventional processing. When forming an interface the substrate also provides superior chemical and structural stability of the stabilized surface interphase by several orders of magnitude compared to conventional semiconductor surfaces oxides, both in terms of stability duration, surface purity and structural quality. When interfaced with other materials, the combination of the substrate surface prepared according to the invention with high-k dielectrics provide a significant decrease in interfacial states and defect density. The decrease in interfacial states combine with the improved chemical and structural stability decreases leakage currents in gates and improves vastly the control of thickness and electrical characteristics.

High-k dielectric layer may be deposited according to those methods known to those skilled in the art. For example, an High-k dielectric layer may be deposited onto a substrate prepared according to the first aspect of the invention or an interphase according to any aspect of the invention by chemical vapor deposition, plasma-enhanced chemical vapor deposition, atomic layer deposition, spin-coating, spray coating, dip coating (e.g., deposition of a Langmuir-Blodgett film), and the like.

EXAMPLES

Example 1

Wafer Cleaning and Intermediate Processing

An innovative wet chemical clean and passivation for Si(100) wafers was developed in previous research by Atluri and Herbots et al.(see, U.S. Pat. No. 6,613,677). This process is unique in that it produces an ultra-flat (1×1) Si(100) ordered surface with extremely low surface impurity contamination compared to the well-known RCA type wet chemical cleans. After cleaning, intermediate processing of the wafers prior to oxidation included packing the cleaned wafers in polypropylene or fluoropolymer containers under dry nitrogen and sealed in plastic bags filled with dry nitrogen. Wafers were stored in their sealed containers under dry nitrogen for up to a year before thermal processing. Often, wafers were stored under dry nitrogen for 30 minutes to 3 days prior to thermal processing. Wafers stored for over a year in sealed containers under dry nitrogen showed no evidence of an increase in surface contamination (e.g. accumulation of carbonaceous impurities) as measured by TOF-SIMS. TOF-SIMS was collected as described in Herbots, et al., Mater. Sci. Eng. B87, 303 (2001).

Example 2

Thermal Processing

Following the cleaning and intermediate processing (i.e., exposure to a static atmosphere of dry nitrogen for up to a year) described in Example 1, both furnace anneal/oxidation and Rapid Thermal Anneal (RTA)/Oxidation (RTO) were used to oxidize the wafers. RTA and RTO were performed on an AG610i furnace manufactured by AG and Associates. The AG610i was located in a class-10 cleanroom. The quartz chamber has a volume of approximately 60 in$^3$. Dry nitrogen and/or dry oxygen gases can be can be used to control the atmosphere during processing. The maximum flow rate of each gas is approximately 4 L/min.

Furnace processing was performed in a Thermco 9000 furnace also located in the class-10 clean room. The particular furnace used in this study was used exclusively for front end processing including gate oxidation. Exemplary oxide thicknesses are listed in Table 1.

Example 2a

Furnace Anneal

The gate oxide furnace was being held at 650° C. and simultaneously being purged with dry nitrogen during loading. The temperature was then increased at a rate of 5° C./min. in dry nitrogen to the desired temperature of 900° C. The wafers were held at 900° C. for 30 min. in dry nitrogen before decreasing the temperature back down to 650° C. at the same rate.

Example 2b

Rapid Thermal Anneal

The chamber was purged with dry nitrogen for three minutes at a maximum flow rate of 4 L/min. to rid the chamber of air. The temperature was then ramped at a rate of 70° C./sec. to the desired temperature where it was held for a 90-120 sec. anneal. The dry nitrogen flow rate was reduced to 2 L/min. during ramping and annealing.

Example 2c

Rapid Thermal Oxidation

The chamber was purged for three minutes with oxygen at a flow rate of 4 L/min. The temperature was then ramped to the oxidation temperature and held for 5 sec. The oxygen flow was immediately shut off and dry nitrogen began purging the chamber at the maximum flow rate as soon as the thermal ramp down began. As the sample reached 400° C., it was held at this temperature for at least 100 sec. as the chamber was continuing to be purged with dry nitrogen. The temperature was then increased up to 1050° C. and annealed for 90 sec. in a 50% flow of dry nitrogen.

TABLE 1

| Thermal Process | Optical Thickness (Å) |
| --- | --- |
| Passivation Only (No Thermal Processing) | Could not be measured |
| Furnace Anneal - 30 min. at 900° C. in $N_2$ | 20-24 |
| Rapid Thermal Nitrogen Anneal | |
| 90 sec. at 1050° C. in $N_2$ | 19-25 |
| 120 sec. at 750° C. in $N_2$ | 10-16 |
| Rapid Thermal Oxidation | |
| 5 sec. at 1100° C. in $O_2$: followed by 90 sec. $N_2$ anneal at 1050° C. | 42-47 |
| 150 sec. at 800° C. in $O_2$: followed by 60 sec. $N_2$ anneal at 800° C. | 20-22 |
| 150 sec. at 750° C. in $O_2$: followed by 90 sec. $N_2$ anneal at 750° C. | 17-18 |
| 360 sec. at 800° C. in $O_2$: followed by 60 sec. $N_2$ anneal at 800° C. | 25-32 |
| 900 sec. at 800° C. in $O_2$: followed by 60 sec. $N_2$ anneal at 800° C. | 31-37 |
| Furnace Oxidation <750° C. | 25-26 |
| Furnace Oxidation <750° C. | 25-27 |
| Furnace Oxidation <750° C. | 34-36 |
| Furnace Oxidation <750° C. | 43-44 |
| Furnace Oxidation <750° C. | 20-21 |

Example 3

Comparison to Standard RCA Cleans

In order to accurately measure the effects the methods of the invention had on oxide films, electrical properties of oxides prepared according to Examples 1 and 2 were compared with a set of control samples which were simultaneously oxidatively processed. The control samples underwent a standard RCA clean used currently in the semiconductor industry. Both sets of samples were then oxidized using a standard recipe for gate oxide formation in industry.

Table 2 is a comparison of the measured oxide charge obtain with SCA analysis for the samples having undergone the Herbots-Atluri wet chemical cleaning procedure.

TABLE 2

Comparison of oxide charge measured between HF/Methanol and Standard RCA prepared surfaces.

| Oxide Optical Thickness (Å) | Oxides of the Invention Oxide Charge $(cm^{-2}) \times 10^{11}$ | Control Oxides Oxide Charge $(cm^{-2}) \times 10^{11}$ |
| --- | --- | --- |
| 20.5 | 2.57 ± 0.24 | 2.78 ± 0.02 |
| 25 | 1.40 ± 0.41 | 0.60 ± 0.51 |
| 35 | 2.29 ± 0.10 | 1.68 ± 0.04 |
| 44 | 1.60 ± 0.06 | 0.97 ± 0.08 |

Samples prepared by the methods of the invention have slightly larger values of oxide charge density. However, the error bars for invention treated samples and the control samples tend to overlap. SCA results of interface trap densities for Samples prepared by the methods of the invention and standard RCA clean (control) prior to oxidation are shown in Table 3.

TABLE 3

Comparison of density of interface traps measured between HF/Methanol and Standard RCA prepared surfaces.

| Oxide Optical Thickness (Å) | Oxides of the Invention Density of Interface Traps $(cm^{-2}) \times 10^{11}$ | Control Oxides Density of Interface Traps $(cm^{-2}) \times 10^{11}$ |
| --- | --- | --- |
| 20.5 | 1.62 ± 0.09 | 1.57 ± 0.01 |
| 25 | 1.52 ± 0.23 | 1.46 ± 0.19 |
| 35 | 1.39 ± 0.05 | 1.33 ± 0.09 |
| 44 | 1.05 ± 0.06 | 1.16 ± 0.17 |

No significant difference was detected between the two surface cleans. Minority carrier lifetime measurements using SCA analysis also showed both surface preparations were within error of one another and are compared in Table 4.

TABLE 4

Comparison of minority carrier lifetimes measured between HF/Methanol and Standard RCA prepared surfaces.

| Oxide Optical Thickness (Å) | Oxides of the Invention Minority Carrier Lifetime (µs) | Control Oxides Minority Carrier Lifetime (µs) |
| --- | --- | --- |
| 20.5 | 235 ± 15 | 227 ± 5 |
| 25 | 192 ± 16 | 181 ± 11 |
| 35 | 202 ± 18 | 196 ± 20 |
| 44 | 222 ± 24 | 221 ± 26 |

Finally, comparison of leakage current and capacitance results for both the samples prepared by the methods of the invention and standard RCA clean also show no difference. Samples prepared by the methods of the invention were prepared several weeks prior to thermal processing as stored under a static atmosphere of dry nitrogen in sealed containers until immediately prior to oxidation. Samples undergoing a traditional RCA clean were cleaned within hours of being loaded into the furnace.

Example 4

Ion Beam Analysis and Modeling

The IBA methodology utilized for analysis of $SiO_2/Si$ (100) prepared according to Examples 1 and 2 has been described in the literature (see, Shaw et al., *J. Appl. Phys.*, 100, 1 (2006); Atluri, et al., Nucl. Instrum. Methods Phys. Res. B118, 144 (1996); Feldman, et al., *Fundamentals of Surface and Thin Film Analysis* (North-Holland), New York, (1986) Feldman and Picraux, *Materials Analysis by Ion Channeling* (Academic, New York, 1982); and Leavit, et al., Nucl. Instrum. Methods Phys. Res. B44, 260 (1990)). Presently, the structure of the new $SiO_2$ nanophase was determined via 3DMultiString simulations of IBA data (see, Shaw et al., J. Appl. Phys., 100, 1 (2006)).

Registry of <100>, <110>, and <111> axes in $SiO_2$ polymorphs with Si(100) were analyzed for (a) α-quartz, (b) β-quartz, (c) β-tridymite, (d) α-cristobalite, (e) β-cristobalite, and (f) keatite, shown in FIGS. 1 (*c*) and (*d*). The only cubic silica phase, β-cristobalite, can register with (1×1) Si(100) along all three axes; (FIG. 1.(*d*)-(*e*)). An often cited candidate is tridymite (e.g., Ourmazd, et al., Phys. Rev. Lett., 59, 213 (1987); and Munkholm, et al., Phys. Rev. Lett. 75, 4254 (1995)), but does not allow 3-axis registry because it is not cubic (FIG. 1(*a*)-(*c*)).

3DMultiString simulated IBA channeling spectra of β-cristobalite nanofilms on (1×1) Si(100) from 4 to 50 monolayers to match 3.045 MeV $^4He^{++}$ IBA data along <100>, <110>, and <111> as a function of $SiO_2$.thickness. The surface peaks (SP) of oxygen and Si were extracted as in IBA (see, Feldman, et al., supra). Si SP were then plotted versus oxygen coverage.

Simulations of Si SP versus oxygen coverage for all three axes were superimposed on the corresponding data. The key feature of IBA data from the new β-c $SiO_2$ interphase on (1×1) Si(100) is "missing" silicon seen along the <111> axis (e.g., Shaw, et al., J. Appl. Phys., 100, 1 (2006)). The interpolation line of the Si SP intersects the oxygen null coverage axis well below the value of the bulk Si SP of the (1×1) Si(100). This yields the areal density of a heteroepitaxial β-c $SiO_2$ nanofilm whose Si atoms shadow "missing" bulk Si(100) atoms as detected by this intercept with the y-axis. Such shadowing by Si in $SiO_2$ of the Si in the bulk Si(100) has never been reported before in IBA of $SiO_2$/Si phases. Only a heteroepitaxial layer can reduce the Si SP below the bulk value, in contrast to simply ordered $SiO_2$/(1×1)Si(100) previously reported (e.g., U.S. Pat. No. 6,613,677 (2003); Herbots, et al., Mater. Sci. Eng. B87, 303 (2001); and Shaw, et al., J. Appl. Phys., 100, 1 (2006)) where elimination of interface disorder merely yields a Si SP at the interface equal to the bulk value of (1×1) Si(100). Shadowing effects observed from the SP data indicated actual registry with (1×1) Si(100).

Figure 2:
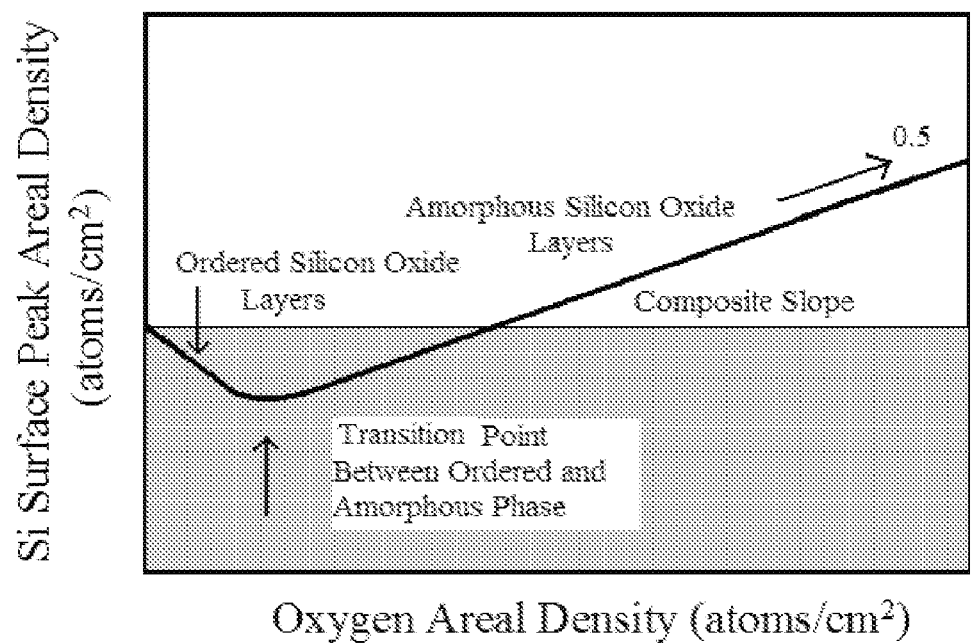
FIG. 2 is a schematic depicting the behavior of the Si SP versus oxygen coverage.

FIG. 2 depicts the experimental data simulated, i.e. Si SP areal density versus the oxygen coverage. At the interface, no surface disorder was detected since the y-intercept of the $SiO_2$ film exactly intersects the y-intercept of the bulk (1×1) Si(100) substrate. Hence, the net number of displaced atoms at the β-c $SiO_2$/(1×1) Si(100) interface equals the total number of Si SP atoms/cm² minus the well-established value of (1×1) Si(100) bulk silicon SP of atoms/cm.² The net number of displaced atoms was zero:

$$A_{Displaced\ Atoms\ at\ Interface} = A_{Total\ Si\ SP} - A_{(1\times1)\ Si}(100)$$
Bulk Silicon SP=0

Since the y-intercept corresponds to Si/$SiO_2$ interface with no oxygen, the Si SP arises entirely from the Si surface. The (1×1) Si(100) SP is represented by the thick horizontal line for reference. If $SiO_2$ grown on (1×1) Si(100) is ordered at the interface, and the Si atoms in the $SiO_2$ register with Si atoms in (1×1) Si(100), the Si atoms within the growing $SiO_2$ progressively shadow Si atoms in (1×1) Si(100). Shadowing from registered Si atoms in the oxide yields a negative slope for the Si SP as oxygen coverage (and thus oxide thickness) increases, as long as the oxide remains heteroepitaxial. As the $SiO_2$ phase transitions to a-$SiO_2$, the slope for the Si SP versus oxygen coverage also transitions from negative to positive slope. The oxygen coverage at that location enables the determination of the thickness of the ordered phase. As a-$SiO_2$ grows thicker, the slope reaches +0.5, the expected stoichiometry of a-$SiO_2$.

Figure 3:
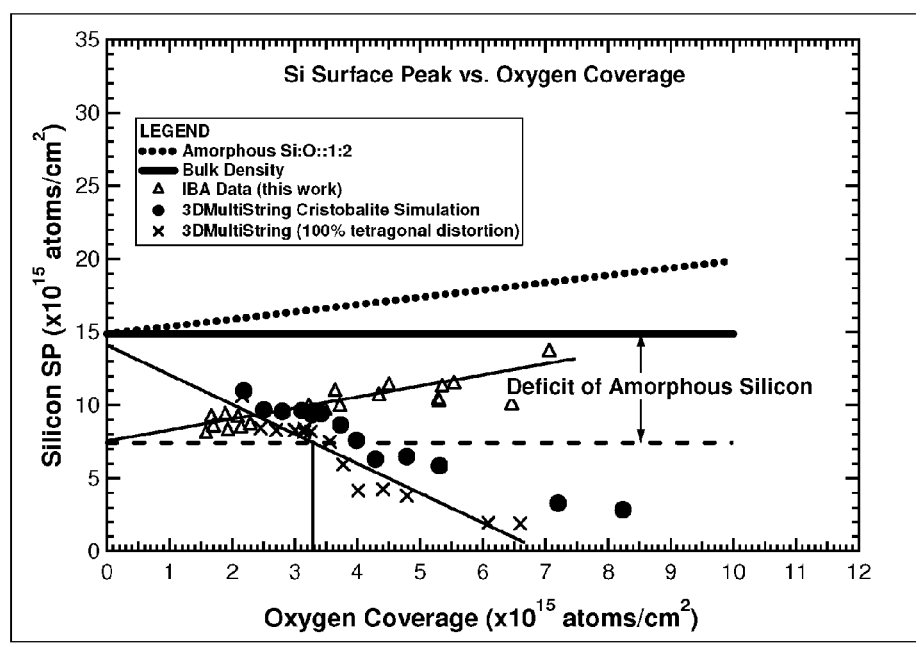
FIG. 3 is a graph illustrating Si SP versus oxygen coverage in the <111> orientation axis with extrapolated experimental and simulated data with tetragonal distortion. Triangle symbols: experimental <111> IBA data. The dotted line shows the yield for amorphous Si:O ratio of 1:2. The solid black horizontal line represents the (1×1)Si(100) bulk SP value in the <111> direction of $14.87 \times 10^{15}$ atom/$cm^2$. The solid circles show 3DmultiString simulations with no tetragonal distortion. The cross symbols represent the simulations results with 100% tetragonal distortion. The Si atoms deficit is marked by the horizontal dashed line, which intersects the simulated β-cristobalite $SiO_2$/(1×1) Si(100) to yield the critical thickness for the heteroepitaxial layer.

FIG. 3 overlays IBA data of the a-$SiO_2$a/β-c $SiO_2$/(1×1) Si(100) stack in the <111> orientation (slope >0) with simulated data for β-c $SiO_2$/(1×1) Si(100) (slope <0) and the thickness of the heteroepitaxial β-c $SiO_2$ interphase was extracted. The experimental slope is found to be greater than +0.5 for the <111> axis. This could at first glance imply a Si:O ratio of greater than 1:2. However, the difference between bulk Si SP (horizontal line) and the fitted slope indicated a deficit of a-Si. Along the <111> axis this deficit is $7.49\times10^{15}$ atom/cm²: The γ-intercept of the IBA data was 50% below that of the bulk Si(100) SP. This large deficit of Si can be explained by the structure of β-cristobalite along the <111> axis, when compared to <100> and <110>, given the size of the shadow cone created by <111> Si atomic rows. The z-spacing along <111> between Si atoms in β-c $SiO_2$ is as large as 0.71 nm, instead of 0.3 nm along <100> and or 0.5 nm along <110>. This greater shadow cone radius combined with the 70% increase in the projected thickness from the <111> channeling angle enhanced the shadowing effect from registry in the β-c $SiO_2$ nanofilm with the (1×1) Si(100). Finally, while Si atoms can be shadowed by Si atomic rows, the lighter oxygen atoms with larger thermal vibration amplitudes are not significantly shadowed. Lack of oxygen shadowing was established by the oxygen yield in 3.045 MeV $^{16}O(\alpha, \alpha)^{16}O$ NRA channeling and corresponding rotating random spectra being identical within the experimental error of +/−5%. Thus the deficit in Si atoms is due to shadowing, not to an excess of oxygen.

The vertical line in FIG. 3 marking the intersection between IBA data taken on the a-$SiO_2$a/β-c $SiO_2$/(1×1) Si(100) stack and the simulation data for β-c $SiO_2$/(1×1) Si(100) yields the order to disorder transition point within the $SiO_2$ films. The deficit in Si SP areal density was $7.38\times10^{15}$ atom/cm², and the oxygen coverage at the intersection was $4.45\times10^{15}$ atom/cm². Using the well established atomic density of c-Si ($5\times10^{22}$ atom/cm³), the heteroepitaxial interphase thickness was found:

$$\frac{2\times(\text{Oxygen areal density}) + (\text{Silicon areal density})}{\beta - \text{cristobalite volume density}} = 1.085nm$$

The same reasoning yields a thickness for the <100> and <110> axis which match within experimental error since they were collected on the same structures.

Finally, the β-c $SiO_2$ structure was found to be tetragonally distorted along the z-axis in the simulation to constrain the crystal cell to the underlying (1×1) Si(100) given the larger volume of β-c $SiO_2$ atomic cells. The z-axis of β-c $SiO_2$ was expanded by increments up to 100%. Lengthening the crystal cell z-axis increases the shadow cone radius by √d, thus up to 1.4. The negative slope in the 3DMultiString-simulated areal density graphs is then steeper. The closest match to volume conservation of tetragonally distorted β-c $SiO_2$ on (1×1)Si (100), a z-axis expansion of 100%, yields a critical thickness for the heteroepitaxial phase of 2.3, 2.0, and 1.9 nm for <100>, <110>, and <111> respectively, which averages to 2.1 nm +/−0.2 nm. Doubling the z-axis lattice constant across 2 nm to conserves volume while maintaining lattice matching explains the rapid collapse of the β-c SiO$_2$ into a-SiO$_2$ beyond the critical thickness. The plasticity of SiO$_2$ bonds accounts for such a large distortion as compared to elastic materials such as Si, Ge, C and their alloys.

By comparing experimental IBA with simulations, a new SiO$_2$ interphase with a β-cristobalite structure was identified. This new heteroepitaxial β-c SiO$_2$ nanofilm interphase shadows Si atoms along the high tilt angle <111> channeling axis in the Si(100) substrate where the shadow cone radius in the 2-nm interphase is largest, while no disorder was detected at the more shallow interfaces in the <100> and the <110> directions. 3DMultiString confirmed the observed ordering and enabled phase identification and critical thickness detection.

The present invention is illustrated by way of the foregoing description and examples. The foregoing description is intended as a non-limiting illustration, since many variations will become apparent to those skilled in the art in view thereof. It is intended that all such variations within the scope and spirit of the appended claims be embraced thereby. Each referenced document herein is incorporated by reference in its entirety for all purposes.

Changes can be made in the composition, operation and arrangement of the method of the present invention described herein without departing from the concept and scope of the invention as defined in the following claims.

We claim:

1. A method for depositing an ultra-thin epitaxial interfacial phase having at least either a tetragonal distortion up to 100% or a surface atomic step greater than or equal to 100 Å or both on a cleaned semiconductor substrate, the method comprising the steps of:
   cleaning a sealable container according to a semiconductor-grade cleaning process comprising a peroxide solution, to provide a cleaned sealable container;
   cleaning the surface of a semiconductor substrate to provide an initially cleaned semiconductor substrate, wherein
      the cleaning of the surface of the semiconductor substrate comprises a Herbots-Atluri clean, and a Herbots-Atluri clean is the final cleaning performed prior to maintaining the initially cleaned semiconductor substrate in a static and inert atmosphere;
   maintaining the initially cleaned semiconductor substrate in a static and inert atmosphere inside of the cleaned sealable container to provide a cleaned semiconductor substrate having decreased surface carbon contamination with respect to the initially cleaned semiconductor substrate; and
   oxidizing the cleaned semiconductor substrate,
      wherein the initially cleaned semiconductor substrate is maintained in the static and inert atmosphere from the conclusion of the cleaning step until the beginning of the oxidization step; and
      wherein the oxidizing results in deposition of the ultra-thin epitaxial interfacial phase having at least either a tetragonal distortion up to 100% or a surface atomic step greater than or equal to 100 Å or both on the cleaned semiconductor substrate.

2. The method of claim 1, wherein the initially cleaned semiconductor substrate is maintained in the static and inert atmosphere for about 30 seconds to 12 months.

3. The method of claim 1, wherein the static and inert atmosphere comprises a noble gas, nitrogen, or mixtures thereof.

4. The method of claim 3, wherein the static and inert atmosphere comprises semiconductor-grade nitrogen.

5. The method of claim 1, wherein the semiconductor substrate comprises a semiconductor material selected from the group consisting of Si, Si$_x$Ge$_{1-x}$, GaAs, Si$_{1-x-y}$Ge$_x$C$_y$, Si$_{3(1-x)}$Ge$_{3x}$N$_{4(1-\delta)}$, Ge, Ga$_{1-x}$Al$_x$As, Si$_x$Ge$_{(1-x)}$(O$_y$N$_{1-y}$)$_n$, Si$_{1-x-y}$Ge$_x$C$_y$(O$_x$N$_{1-x}$)$_n$, and (Si$_{1-x-y}$Ge$_x$C$_y$)$_3$N$_{4-x-y}$.

6. The method of claim 5, wherein the semiconductor substrate comprises Si; and the ultra-thin epitaxial interfacial phase comprises SiO$_2$.

7. The method of claim 6, wherein the ultra-thin epitaxial interfacial phase comprises beta-cristobalite-SiO$_2$.

8. The method of claim 1, wherein the cleaned semiconductor substrate is oxidized by a semiconductor oxidation process.

9. The method of claim 8, wherein the oxidation process is selected from the group consisting of native oxide formation in ambient air, thermal oxidation, rapid thermal oxidation, and annealing in nitrogen, hydrogen, or a combination thereof.

10. An ultra-thin epitaxial interfacial phase having at least either a tetragonal distortion up to 100% or a surface atomic step greater than or equal to 100 Å or both on a cleaned semiconductor substrate prepared by a process comprising the steps of:
    cleaning a sealable container according to a semiconductor-grade cleaning process comprising a peroxide solution to provide a cleaned sealable container;
    cleaning the surface of a semiconductor substrate to provide an initially cleaned semiconductor substrate,
       wherein the cleaning of the surface of the semiconductor substrate comprises a Herbots-Atluri clean, and a Herbots-Atluri clean is the final cleaning performed prior to maintaining the initially cleaned semiconductor substrate in a static and inert atmosphere;
    maintaining the initially cleaned semiconductor substrate in a static and inert atmosphere inside of the cleaned sealable container to provide a cleaned semiconductor substrate having decreased surface carbon contamination with respect to the initially cleaned semiconductor substrate; and
    oxidizing the cleaned semiconductor substrate,
       wherein the initially cleaned semiconductor substrate is maintained in the static and inert atmosphere from the conclusion of the cleaning step until the beginning of the oxidization step; and
       wherein the oxidizing results in deposition of the ultra-thin epitaxial interfacial phase having at least either a tetragonal distortion up to 100% or a surface atomic step greater than or equal to 100 Å or both on the cleaned semiconductor substrate.

11. The interfacial phase of claim 10, wherein the static and inert atmosphere comprises a noble gas, nitrogen, or mixtures thereof.

12. The interfacial phase of claim 10, wherein the initially cleaned semiconductor substrate is maintained in the static and inert atmosphere for about 30 seconds to 12 months.

13. The interfacial phase of claim 10, wherein the semiconductor substrate comprises a semiconductor material selected from the group consisting of Si, Si$_x$Ge$_{1-x}$, GaAs, Si$_{1-x-y}$Ge$_x$C$_y$, Si$_{3(1-x)}$Ge$_{3x}$N$_{4(1-\delta)}$, Ge, Ga$_{1-x}$Al$_x$As, Si$_x$Ge$_{(1-x)}$(O$_y$N$_{1-y}$)$_n$, Si$_{1-x-y}$Ge$_x$C$_y$(O$_x$N$_{1-x}$)$_n$, and (Si$_{1-x-y}$Ge$_x$C$_y$)$_3$N$_{4-x-y}$.

14. The interfacial phase of claim 13, wherein the semiconductor substrate is Si(100).

15. The interfacial phase of claim 10, wherein
the ultra-thin interfacial phase comprises $SiO_2$; and
the semiconductor substrate comprises Si.

16. The interfacial phase of claim 15, wherein the ultra-thin epitaxial interfacial phase comprises beta-cristobalite $SiO_2$.

17. The interfacial phase of claim 15, wherein the ultra-thin epitaxial interfacial phase has a silicon surface peak at zero oxygen coverage of less than bulk Si(100) as measured along the <111> axis by ion beam analysis.

18. The interfacial phase of claim 15, wherein the interfacial phase is a cubic cristobalite phase or a tetragonally distorted cristobalite phase.

19. The interfacial phase of claim 18, wherein
the interfacial phase is tetragonally distorted normal to the semiconductor substrate surface interface, with an expansion of the crystal unit cell dimensions ranging from 0 to 150% along the surface normal, wherein
substantially all atoms are arranged in unit cells whose main axes are aligned in the same orientation;
only the <100> axes of the interfacial phase are aligned with the Si substrate; and
the <110> and <111> axes of the interfacial phase are shifted to accommodate the tetragonal distortion of the phase.

20. A semiconductor structure comprising a cleaned semiconductor substrate, an ultra-thin epitaxial interfacial phase comprising cubic cristobalite phase or a tetragonally distorted cristobalite phase and having at least either a tetragonal distortion up to 100% or a surface atomic step greater than or equal to 100 Å or both, and a high-k dielectric, wherein the interfacial phase is between the cleaned semiconductor substrate and the dielectric, and is prepared according to the method comprising the steps of,
cleaning a sealable container according to a semiconductor-grade cleaning process comprising a peroxide solution to provide a cleaned sealable container;
cleaning the surface of a semiconductor substrate to provide an initially cleaned semiconductor substrate, wherein
the cleaning of the surface of the semiconductor substrate comprises a Herbots-Atluri clean, and a Herbots-Atluri clean is the final cleaning performed prior to maintaining the initially cleaned semiconductor substrate in a static and inert atmosphere;
maintaining the initially cleaned semiconductor substrate in a static and inert atmosphere inside of the cleaned sealable container to provide a cleaned semiconductor substrate having decreased surface carbon contamination with respect to the initially cleaned semiconductor substrate; and
oxidizing the cleaned semiconductor substrate,
wherein the initially cleaned semiconductor substrate is maintained in the static and inert atmosphere from the conclusion of the cleaning step until the beginning of the oxidization step.

21. The semiconductor structure of claim 20, wherein the high-k dielectric comprises $HfO_2$, HfSiON, or $ZrO_2$.

22. The semiconductor structure of claim 20, wherein
the semiconductor substrate comprises Si.

23. The semiconductor structure of claim 22, wherein the semiconductor substrate is Si(100).

* * * * *